United States Patent [19]

Ishii et al.

[11] Patent Number: 4,851,263
[45] Date of Patent: Jul. 25, 1989

[54] METHOD AND APPARATUS FOR APPLICATION OF WAX ON WAFERS

[75] Inventors: Keiichi Ishii, Yonezawa; Yukio Tsutsumi; Kazunori Saeki, both of Noda; Mitsuji Koyama, Nagareyama, all of Japan

[73] Assignees: Mitsubishi Kinzoku Kabushiki Kaisha; Japan Silicon Co., Ltd., both of Tokyo, Japan

[21] Appl. No.: 111,540

[22] Filed: Oct. 23, 1987

[30] Foreign Application Priority Data

Oct. 23, 1986 [JP] Japan .................. 61-252173
Oct. 23, 1986 [JP] Japan .................. 61-252174
Sep. 2, 1987 [JP] Japan .................. 62-219578
Sep. 2, 1987 [JP] Japan .................. 62-219579

[51] Int. Cl.$^4$ .................. B05D 3/12; B05D 1/18; B05C 3/02; B05C 13/02
[52] U.S. Cl. .................. 427/240; 427/96; 427/384; 427/443; 118/52; 118/53; 118/56; 118/409; 118/410
[58] Field of Search .................. 427/240, 96, 384, 443; 118/409, 410, 52, 53, 56

[56] References Cited

U.S. PATENT DOCUMENTS 4,476,162 10/1984 Ireland .................. 427/240
4,590,094 5/1986 Ringer .................. 427/240

Primary Examiner—Janyce Bell
Attorney, Agent, or Firm—Cushman, Darby & Cushman

[57] ABSTRACT

A method and an apparatus for applying molten wax to one face of a wafer is disclosed. A container having an upwardly facing opening contains the molten wax. The wafer is held substantially horizontally above the opening of the container, with one face of the wafer facing downwardly toward the opening of the container. At least one of the container and the wafer is moved toward the other to bring the opening of the container and underside of the wafer into contact with each other to thereby apply a predetermined amount of molten wax within the container to the underside of the wafer. Preferably, the container is filled with the molten wax such that the molten wax stands up, under surface tension, above a peripheral edge of the opening of the container. Preferably, the wafer is spinned around its central axis in a high speed so that the molten wax applied at the central portion thereof is spread on the entire surface of the wafer and that the extra wax is scattered out of the wafer. Preferably, walls surrounding the spinning wafer is heated at a temperature higher than the melting point of the wax so that the wax spinned off the wafer may not scatter in the air as particles.

21 Claims, 3 Drawing Sheets

METHOD AND APPARATUS FOR APPLICATION OF WAX ON WAFERS

BACKGROUND OF THE INVENTION

The present invention relates to a method and an apparatus used to apply viscous liquid to one face of plates. More specifically, the present invention relates to a method which is suitably used for applying molten wax uniformly to one face of silicon wafers for use in integrated circuits, prior to a subsequent process such as grinding or abrading the other face of the wafer. The present invention also relates to an apparatus to be used for reducing the above method to embodiments.

When wafers are to be fixed to a carrier plate for mirror-finishing their front faces, generally, molten wax is applied beforehand to the back face of the wafers so as to coat the face with it in a uniform thickness. Then, the wafers are secured to the carrier plate by means of the wax. Subsequently, the front face of the wafer is mirror-finished.

One of the conventional methods to apply molten wax uniformly to a wafer is to spray the molten wax downwardly onto an upwardly facing surface of the wafer which is being delivered by a transport belt or the like (first conventional method). The other method is to drop one or more drops of molten wax onto an upwardly facing surface of the wafer and spin the wafer about its central axis in high speed so that the dropped molten wax is spread uniformly on the surface under centrifugal force (second conventional method).

It is difficult by the first conventional method, however, to apply the molten wax evenly so as to cover the surface in a uniform thickness. Further, the wax applied to the upwardly facing surface might dribble down from the outer peripheral edge of the wafer and stick to the other surface thereof. Still further, particles floating in the air are apt to stick on the waxed surface because the wax is generally sticky. By the second conventional method, on the other hand, wax can be spread evenly by the spin. But, the amount of particles sticking on the waxed surface further increases because a great number of particles are generated and scattered in the air during the spin wherein a considerable portion of the dropped wax is spinned off the wafer and splashes on the surrounding walls. When the wafer is broken accidentally during the spin, scattering fragments may stick on the waxed surface of adjacent wafers. Further, molten wax may drop inadvertently on the wafer after the wax is applied and spread thereover evenly by the spin. Further, bubbles are apt to be contained in the drop of wax which prevent the wax from being spread evenly on the surface and make dimples wherein the wax is not applied to the wafer.

If the wax is unevenly applied, dimples are formed, the wax contains bubbles, or particles are sticked to the waxed surface, the wafer would tilt or deform delicately and irreguraly exerting a defective influence especially in a succeeding photo lithographycal process wherein flatness of the surface must be maintained strictly.

SUMMARY OF THE INVENTION

It is thus an object of the present invention to provide a reliable and accurate method to apply molten wax uniformly to one face of a wafer so as to coat it with a thin wax layer. More precisely, an object of the present invention is to decrease the generation of defects in the coating layer of wax, such as uneven thickness of wax, dimples, sticked particle etc fragments.

It is another object of the invention to provide an apparatus for carrying the above method into practice.

Further objects of the present invention will become clear throughout the description hereunder.

According to the present invention, there is provided a method of applying molten wax to one face of a wafer, comprising the steps of:

preparing a container filled with the molten wax and having an upwardly facing opening;

holding the wafer substantially horizontally above the opening of the container, with one face of the wafer facing downwardly toward the opening of the container; and moving at least one of the container and the wafer toward the other to bring the opening of the container and the downwardly facing face of the wafer into contact with each other to apply a predetermined amount of molten wax within the container to the underside of the wafer.

Preferably, above step is succeeded by a step of spinning the wafer around a vertically extending central axis to spread the molten wax radially outwards over the entire surface. In a modified method according to the present invention, a step of supplying molten wax to the container is added to the above-mentioned steps. Further, in a preferred embodiment, the molten wax is supplied to fill the container so that the molten wax stands up, under surface tension, above the peripheral edge of the container. Further, the step of suplying molten wax may comprise a step of filtering out the particles contained in the molten wax. In a further modified embodiment, the method comprises a step of gathering the wax spinned off the wafer and merge it into the molten wax in the container to use it again for coating succeeding wafers.

According to the invention, there is also provided an apparatus for applying molten wax to one face of a wafer, the apparatus comprising:

a container filled with the molten wax and having an upwardly facing opening;

holder means for holding the wafer substantially horizontally above the opening of the container, with one face of the wafer facing downwardly toward the opening of the container; and moving means for moving at least one of the container and the wafer toward the other to bring the opening of the container and the downwardly facing face of the wafer into contact with each other to apply a predetermined amount of molten wax within the container to the underside of the wafer.

Preferably, above apparatus comprises means for rotating the wafer around a vertically extending central axis to spread the molten wax radially outwards over the entire surface. Further modified embodiment comprises means for supplying molten wax to the container so that the molten wax stands up, under surface tension, above the peripheral edge of the container. Further, the means for supplying molten wax may comprise a means for filtering out particles contained in the molten wax. In a further modified embodiment, the apparatus comprises a heater to heat the walls surrounding the spinning wafer so that the spinned off wax may not freeze and particles may not be scattered in the air to float therein.

DETAILED DESCRIPTION

The invention will be described in detail, by way of mere example, with reference to the accompanying drawings.

Figure 1:
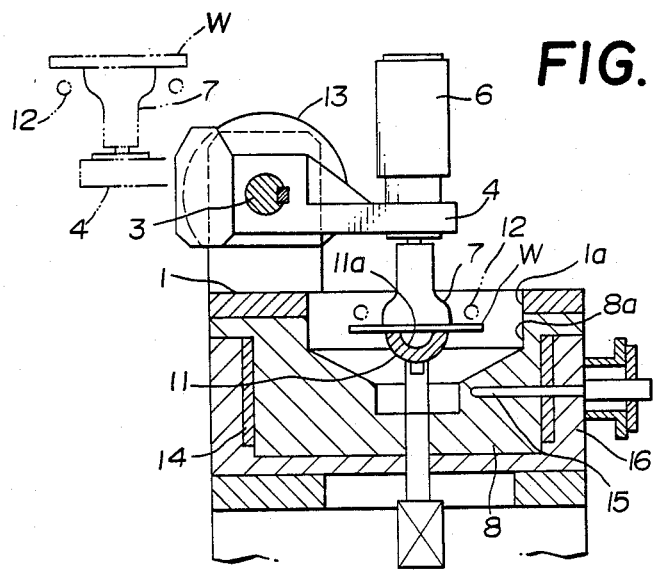
FIG. 1 is a cross-sectional face view of a wax applying apparatus, an embodiment of the invention.
Figure 2:
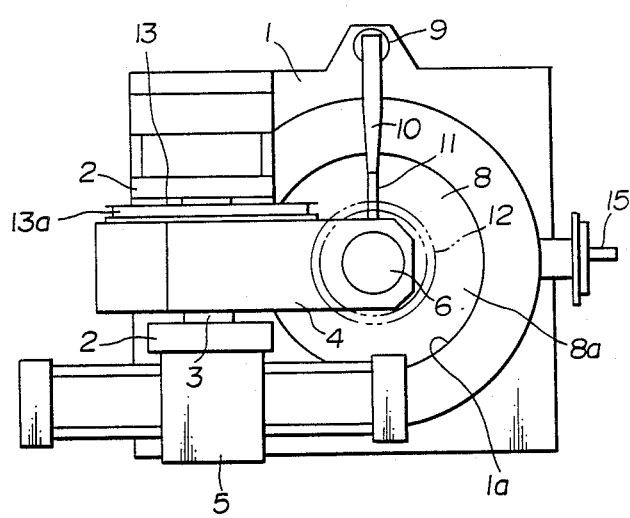
FIG. 2 is a top plan view of the apparatus illustrated in FIG. 1.
Figure 3:
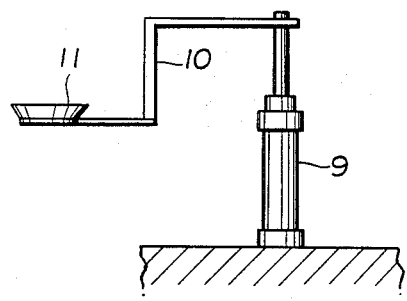
FIG. 3 is a fragmental face elevational view showing a container filled with molten wax and a hydraulic actuator for vertically moving the container, incorporated in the apparatus illustrated in FIGS. 1 and 2.

Reffering to FIGS. 1 through 3, there is illustrated an apparatus for applying molten wax to one face of a wafer W, according to the invention. The apparatus comprises a generally box-like base 1 having a top surface formed with a circular opening 1a. As shown in FIG. 2, a pair of supports 2 and 2 are mounted on the base 1 in spaced and confronting relation to each other. A support shaft 3 having a horizontally extending axis is rotatably supported by the supports 2 and 2. A support arm 4 is mounted on the support shaft 3 for rotation therewith. A rotary actuator 5 mounted on one of the supports 2 and 2 has an output shaft which is drivingly connected to one end of the support shaft 3, for angularly moving the support arm 4 by 180 degrees about the axis of the support shaft 3 between a solid line position and a phantom line position in FIG. 1. A motor 6 is mounted on an upper surface of a forward end of the support arm 4 when the same is in the solid line position. The motor 6 has an output shaft which extends through the forward end of the support arm 4. A holder 7 such as a suction cup is fixedly mounted on the projecting end of the output shaft of the motor 6. The holder 7 applies vacuum to a central region on the upper face of the wafer W opposite to the under face thereof to which the molten wax is to be applied, to hold the wafer W. A ring heater 12 is arranged about the outer periphery of the holder 7 to heat the wafer W held thereon, to a predetermined temperature. Thus, it will be understood from the foregoing that the holder 7, the wafer W and the motor 6 are angularly moved by the rotary actuator 5 by 180 degrees about the horizontally extending axis of the support shaft 3 between first and second positions. The first position wherein the holder 7 holds the wafer W horizontally with the back face thereof facing upwardly is indicated by phantom lines in FIG. 1. The second position wherein the holder 7 holds the wafer W horizontally with the back face thereof facing downwardly is indicated by solid lines in FIG. 1.

As clearly shown in FIG. 1, a reservoir 8 having a recess 8a therein is mounted in the base 1. The recess 8a contains molten wax and has an upper opening aligned with the opening 1a of the base 1. A cup-like or dish-like container 11 is arranged within the recess 8a and has an upwardly facing opening which is smaller in area than the front face of the wafer W. When the holder 7 is moved to the abovementioned second position, the back face of the wafer W faces downwardly towards the opening of the container 11. As shown in FIG. 3, the container 11 is connectred, through an L-shaped bracket 10, to a vertically extending piston rod of a hydraulic actuator 9 which is mounted to a face of the base 1. The hydraulic actuator 9 serves to move the container 11 vertically toward and away from the downwardly facing back face of the wafer W, between a downward position and an upward position. In the downward position, the container 11 is fully immersed in the molten wax within the recess 8a to fill the container 11 with the molten wax. In the upward position, the container 11 emerges out of the molten wax and the opening of the container 11 is brought into contact with a central region of the downwardly facing back face of the wafer W to apply the molten wax thereon.

A band heater 14 is arranged around the outer periphery of the reservoir 8 to heat the reservoir 8 and the molten wax in the recess 8a. A temperature sensor 15 is inserted into the peripheral wall of the reservoir 8 to measure temperature of the molten wax in the recess 8a, and generates a signal representative of the temperature. A controller, not shown, is in response to the signal from the temperature sensor 15 to control electric current supplied to the band heater 14, in order to keep the reservoir 8 and the molten wax in the recess 8a to a predetermined temperature which is normally higher than the melting point of the wax. The reservoir 8 is surrounded by a layer 16 of heat insulating material such as glass fibers.

As shown in FIG. 2, an accomodating plate 13 is mounted on one face of the support arm 4 adjacent to the other support 2. The accomodating plate 13 is provided with a groove 13a for accomodating a hydraulic fluid hose, electric power lines and the like. The hydraulic fluid employed may be oil or air.

The operation of the apparatus as illustrated in FIGS. 1 through 3 will be described hereafter.

A preheated wafer W is delivered by a transport belt or the like, with the back face of the wafer W facing upwardly. The support arm 4 is the first position indicated by the phantom lines in FIG. 1. The holder 7 mounted on the support arm 4 is brought into engagement with the downwardly facing front face of the wafer W. The holder 7 applies vacuum to the central region of the front face of the wafer W to hold the same. The wafer W held on the holder 7 is heated by the ring heater 12 arranged about the periphery of the holder 7, to prevent the temperature of the wafer W from lowering during the procedures within which the wafer W is held by the holder 7. Then, the rotary actuator 5 is operated to angularly move the support arm 4 together with the holder 7 having thereon the wafer W, clockwise by 180 degrees about the axis of the support shaft 3 to the second position indicated by the solid lines in FIG. 1. In the second position, the back face of the wafer W faces downwardly toward the opening of the container 11. Then the hydraulic actuator 9 is operated to vertically move the container 11 from the downward position where the container 11 is immersed in the molten wax within the recess 8a of the reservoir 8, toward the upward position. As the container 11 emerges out of the molten wax in the recess 8a, the container 11 is filled with the molten wax such that the molten wax stands up, under surface tension, above the peripheral edge of the opening of the container 11. As the container 11 is moved by the hydraulic actuator 9 to the upward position, the peripheral edge of the container 11 is brought into contact with the downwardly facing back face of the wafer W to apply a predetermined amount of molten wax standing out of the container 11 to the central region of the back face. After the application of the molten wax, the hydraulic actuator 9 is operated to move the container 11 to the downward position to fully immerse the container 11 in the molten wax within the recess 8a of the reservoir 8. Subsequently, the motor 6 is operated to spin the holder 7 and the wafer W at high rotational speed about the vertically extending central axis of the wafer W. This causes the molten wax, applied to the central region of the back face of the wafer W, spread under centrifugal force radially outwards over the entire surface of the face. Thus, the molten wax is uniformly applied to the back face of the wafer W. During this spin, a considerably portion of the applied wax is spinned off the wafer. When the temperature of the inner surface of the reservoir 8 is kept higher than the melting point of the wax, the wax spinned off the wafer is prevented from freezing and scattering in the air as floating particles. The wax received by the inner wall of the reservoir 8 is lead to and gathered in the reservoir 8 again and merges in the wax contained in the reservoir 8. Subsequently, the support arm 4 is angularly moved by rotary acturator 5 to move the holder 7 and the wafer W to the first position. In the first position, the vacuum is released from the holder 7, and the wafer W having the wax-applied face is removed from the holder 7 and is replaced by new one.

In the manner described above, the molten wax is uniformly, quickly and smoothly applied to the back face of the wafer W to coat it. In this connection, since the molten wax is applied from below to the downwardly facing back face of the wafer W, it is ensured that the molten wax is applied only to the face without any adhesion to the other faces of the wafer W. Further, because of the same reason, the waxed surface is free from particles sticking thereto. Still further, also because the waxed surface is downwardly facing, the surface is protected from broken fragments sticking thereto even when an adjacent wafer, spinning at a same time, is broken and fragments are scattered. Because the inner surface of the reservoir 8 is heated at a temperature higher than the melting point of the wax, not only the wax is refained from scattering into the air as floating particles but also the wax, once applied to the wafer and spinned off therefrom, is utilised again for application to the wafer. Then, the wafer W is bonded to a carrier plate in a reliable and precise manner at the subsequent step following the wax-applying step. Further, the part of the molten wax, standing up under surface tension above the peripheral edge of the opening of the container 11, is applied to the face of the wafer W. This ensures that the amount of molten wax applied to the back face is maintained constant and does not vary from wafer to wafer. Moreover, it becomes possible to regulate the amount of molten wax to be applied to the back face of the wafer, even though the dimensions of the wafer vary, only by changing the dimension or area of the opening of the container 11. Further, bubbles are excluded from being captured in the wax to be applied to the wafer. Thus, an application of wax to wafers, in a uniform and constant thickness, without defects such as dimples and sticked particles, is accomplished according to the present embodiment.

Figure 5:
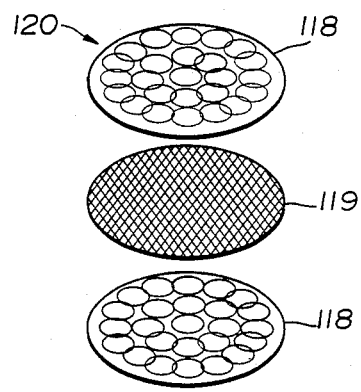
FIG. 5 is an exploded perspective view showing, on an enlarged scale, a filter assembly incorporated in the apparatus of FIG. 4.
Figure 4:
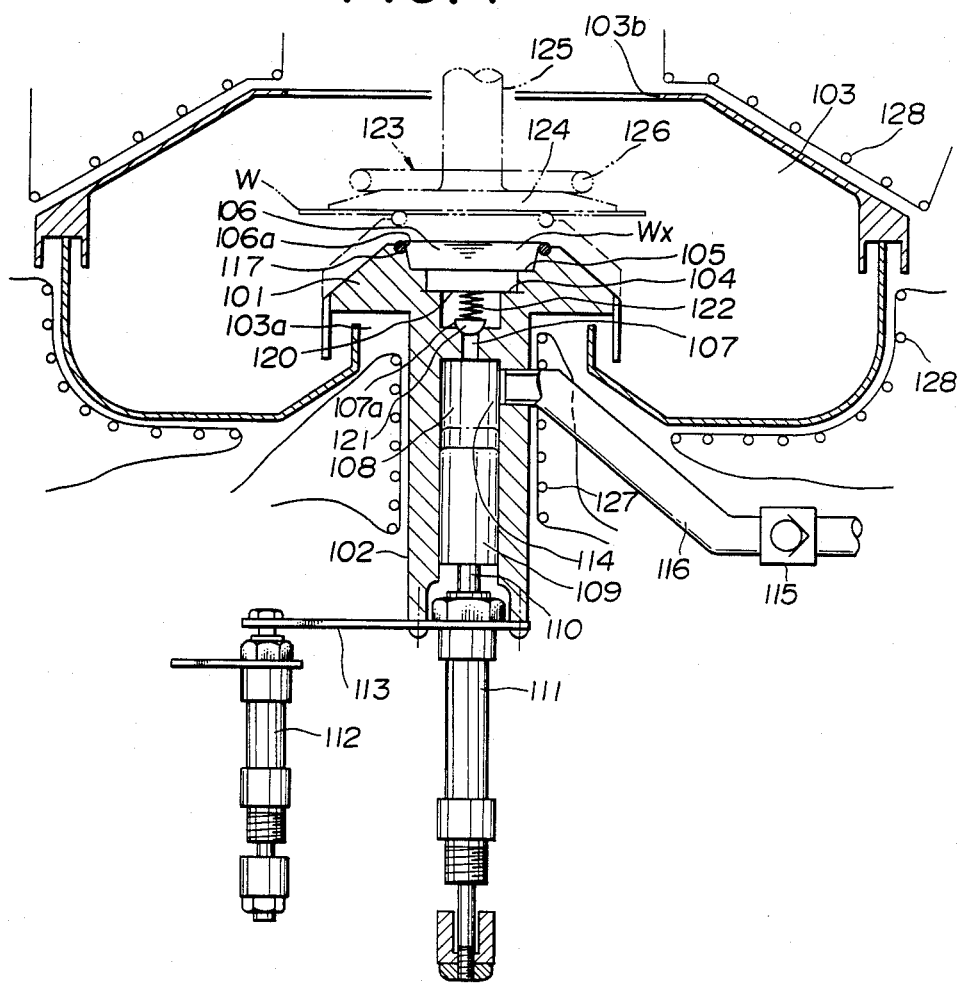
FIG. 4 is a fragmental cross-sectional view showing a wax applying apparatus according to another embodiment of the invention.

FIGS. 4 and 5 show another embodiment of the invention. A container 101 having a stepped conical inner surface is arranged within an application chamber 103 defined in a base like the base 1 shown in FIG. 1. The application chamber 103 has a lower central opening 103a and an upper central opening 103b. The container 101 is formed with a recess 106 filled with molten wax Wx. The wall surface of the recess 106 is provided with steps 104 and 105 so that the diameter of the recess 106 increases stepwise from the bottom toward the opening 106a. A cylinder 102 having a lower open end is integrally connected to the underside of the container 101 and extends through the lower central opening 103a. The bottom of the recess 106 communicates with a cylinder chamber 108 through a communication passage 107 having a relatively small cross-sectional area. The cylinder chamber 108 is filled with the molten wax Wx. A piston 109 is slidably received in the cylinder chamber 108. A connecting plate 113 is secured to the lower end of the cylinder 102. A main hydraulic actuator 111 has a cylinder fixedly mounted to the connecting plate 113. The main hydraulic actuator 111 has a piston rod 110 which has a forward end connected to the piston 109, to vertically move the piston 109 within the cylinder chamber 108. An auxiliary hydraulic actuator 112 has a piston rod fixedly connected to the connecting plate 113 to vertically move the cylinder 102 and the container 101 together with the main hydraulic actuator 111. The main hydraulic actuator 111 is so set that the molten wax Wx of an amount for one wafer W is supplied from the cylinder chamber 108 to the recess 106 through the communication passage 107 by one forward stroke of the piston rod 110. An inlet port 114 is provided at an upper end of the cylinder chamber 108. Connected to the inlet port 114 is a supply pipe 116 which is connected to a wax tank, not shown, through a check valve 115.

An O-ring 117 formed of a resilient or elestic material such as tetrafluoroethylene is fitted in the opening 106a of the recess 106. The O-ring 117 is so set as to have its upper edge strictly positioned in a horizontal plane. An opening defined by the upper peripheral edge of the O-ring 117 is smaller in area than the wafer W. A filter assembly 120 is fixedly fitted in the step 104 of the recess 106. As shown in FIG. 5, the filter assembly 120 comprises a pair of perforated retaining disc 118 and 118 and a screen disc 119 clamped therebetween. The screen disc 119 has its meshes on the order of 0.2 to 0.5 micron meters. The communication passage 107 has stepped conical upper peripheral edge 107a serving as a valve seat against which a valve member 121 is seated. A spring 122 is interposed between the filter assembly 120 and the valve member 121 to bias the latter toward the upper peripheral edge 107a. The valve member 121 and the spring 122 form a check valve which permits the molten wax Wx to flow only from the cylinder chamber 108 to the recess 106 through the communication passage 107.

A holder 123 is comprised of a disc-shaped face plate 124 and a tubular body 125 connected to a rear end face of the face plate 124. The holder 123 can be angularly moved between a first position outface the application chamber 103 and a second position within the application chamber 103 through the upper central opening 103b, by a mechanism like that described with reference to the embodiment illustrated in FIGS. 1 and 2. In addition, the holder 123 is rotated about a central axis of the face plate 124 and the tubular body 125 by a motor like the motor 5 illustrated in FIGS. 1 and 2. A ring heater 126 is mounted about the tubular body 125 adjacent to the rear end face of the face plate 124 to heat the wafer W held thereon to a predetermined temperature. Although not shown, a shallow recess is formed in the front end face of the face plate 124. A suction port connected to a vacuum pump is formed at the bottom of the shallow recess. A porous ceramic disc is fitted in the shallow recess. A heater 128 is arranged about the application chamber 103 to heat the same to a predetermined temperature normally to a temperature higher than the melting point of the wax. A heater 127 is arranged about the cylinder 102 to heat the molten wax Wx within the cylinder chamber 108 and the recess 106 to a predetermined temperature.

The operation of the wax applying apparatus constructed as shown in FIG. 4 will be described.

When the recess 106 and the cylinder chamber 108 are filled with no molten wax Wx, the main hydraulic actuator 111 is operated to retract the piston rod 110 to thereby move the piston 109 downwardly. This causes the molten wax Wx to be drawn into the cylinder chamber 108 from the wax tank through the check valve 115 and supply pipe 116. Then, the main hydraulic actuator 111 extends the piston rod 110 to move the piston 109 upwardly to pump the molten wax Wx into the communication passage 107. By the molten wax Wx, the valve member 121 is moved away from the upper peripheral edge 107a against the spring 122, to permit the molten wax Wx to flow into the recess 106. This operation is repeated until the recess 106 is fully filled with the molten wax Wx. Then, the hydraulic circuit is switched from the main hydraulic actuator 111 to the auxiliary hydraulic actuator 112. Thus, preparation for wax application is completed.

One operational cycle of applying the molten wax Wx to the wafer W will next be described.

As described previously, the main hydraulic actuator 111 pumps the molten wax Wx of an amount for one wafer W, from the cylinder chamber 108 into the recess 106 through the communication passage 107 by one forward stroke of the piston rod 110. This causes the level of the molten wax Wx stands up, under surface tension, above the upper peripheral edge of the O-ring 117. The filter assembly 120 filtrates the molten wax Wx flowing therethrough to remove fine solid matter from the molten wax Wx, and imparts pressure loss to the flow of the molten wax Wx to reduce the flow velocity thereof, in order to prevent wave motion from occurring on the surface of the molten wax Wxc within the recess 106. On the other hand, when the holder 123 is in the position outface the application chamber 103, the wafer W is mounted on the holder 123 with the one face of the wafer W facing upwardly, and then the vacuum pump is operated to cause the holder 123 to apply vacuum to the central region of the other face of the wafer W to hold the same, in the manner like that described previously with reference to the embodiment illustrated in FIGS. 1 and 2. Subsequently, in the manner also similar to that described in connection with the previous embodiment, the holder 123 having held thereon the wafer W is angularly moved from the position outface the application chamber 103 to the position indicated by the phantom lines in FIG. 4, where the wafer W is held horizontally by the holder 123 with the back face of the wafer W facing downwardly toward the opening 106a of the recess 106. Subsequently, the auxiliary hydraulic actuator 112 is operated to raise the cylinder 102 and the container 101 together with the main hydraulic actuator 111, from the downward position to the upward position to bring the surface of the molten wax Wx within the recess 106 into contact with the central region of the back face of the wafer W. Since a sufficient amount of molten wax Wx is received within the recess 106, the molten wax Wx is difficult to be lowered in surface temperature by the contact with the wafer W, so that the physical property such as viscosity of the molten wax Wx does not substantially vary. The molten wax Wx of the amount corresponding to that standing up under surface tension above the upper peripheral edge of the O-ring 117 adheres to the central region of the back face of the wafer W. Then, the auxiliary hydraulic actuator 112 is reversed to retract the piston rod, to move the container 101 downwardly to the downward position. Subsequently, the holder 123 having held thereon the wafer W is spinned at high speed by the motor like the motor 6 illustrated in FIGS. 1 and 2. The rotation causes the molten wax Wx to be spread under centrifugal force radially outwardly over the entire face of the wafer W, so that the molten wax Wx is applied uniformly to the face. Since the wafer W is preheated, and the holder 123, the cylinder 102 and the application chamber 103 are heated respectively by the heaters 126,127 and 128, the molten wax Wx adhering to the back face of the wafer W is uniformly spread without decreasing its viscosity. After or just before completion of spreading the molten sax Wx over the entire face of the wafer W, the holder 123 and the wafer W are angularly moved from the position within the application chamber 103 to the position outface the same where the wafer W is removed from the holder 123 and is replaced with new one. On the other hand, the main hydraulic actuator 111 is operated to draw a predetermined amount of molten wax Wx from the wax tank into the cylinder chamber 108 through the check valve 115 and the supply pipe 116. The above-described steps are repeated to successively apply the molten wax Wx to wafers W.

Operations and effects additional to those explained for the first embodiment are explained hereafter referring to the embodiment illustrated in FIGS. 4 and 5.

Because the temperature of the application chamber 103 is kept higher than the melting point of the wax, the wax spinned off the wafer does not freeze thus preventing from scattering in the air as floating particles. Therefore, the waxed surface of the wafer is protected from particles sticking thereto. The wax spinned off the wafer is received by the application chamber 103 wall and lead to the cylinder chamber 108 so as to be utilised again for application to the proceeding wafers. Because molten wax is filtrated by the filter assembly 120 before flowing into the recess 106, particles and fragments which may mingled in the molten wax are eliminated and only clean molten wax is applied onto the wafer. Similarly to the above-mentioned primary embodiment, molten wax Wx having flowed into the recess 106 stands up under surface tension avove the opening 106a. Thus, the amount of molten wax Wx applied to the back face of the wafer W is always made constant and the bubbles are eliminated from taken into the wax to be applied to the wafer. Moreover, as described previously, since a sufficient amount of molten wax Wx is contained in the recess 106, a decrease in the surface temperature of the molten wax Wx due to contact thereof with one face of the wafer W is extremely low so that the molten wax Wx maintains its temperature and physical property even after the molten wax Wx adheres to the back face of the wafer. Thus, the molten wax Wx is applied onto the wafer uniformly. Thus, an application of wax to wafers, in a uniform and constant thickness, without defects such as dimples and sticked particles, is accomplished according to the present embodiment.

As described above, according to the present invention, it becomes possible to minimize particles scattered in the air to float therein and to stick to the wax applied underside of the wafer. Further, a constant amount of wax can always be applied only to the face of the wafer, so that a fluctuation in the amount of wax applied on the wafer is restrained. The wax layer is made free from the defects such as dimples, fluctuations in thickness and sticked particles. This ensures that surface levels of the respective wafers bonded to the carrier plate are made uniform and that the wafer is free from irregular deformations. Thus, it becomes possible to obtain wafers which are uniform in their respective ground faces, and which are high in quality.

The invention has been explained according to the method and apparatus to be used for coating wafers with wax. But this invention is applicable not only to above embodiments but also to any wafer processes, processes to coat a surface of wafers with viscose material, in which spin coaters or resist coaters are employed.

What is claimed is:

1. A method of applying molten wax to one face of a wafer, comprising the steps of:
   preparing a container containing the molten wax and having an upwardly facing opening;
   holding the wafer substantially horizontally above said opening of said container, with one face of the wafer facing downwardly toward said opening of said container;
   angularly moving the wafer about a horizontal axis between a first position where the wafer is held substantially horizontally with one face thereof facing upwardly and a second position where the wafer is held with the same face thereof facing downwardly toward said opening of said container;
   moving at least one of said container and the wafer toward the other to bring the peripheral edge of said opening of said container and the downwardly facing face of the wafer into contact with each other to apply a predetermined amount of said molten wax to said one face of the wafer.

2. A method as defined in claim 1, wherein said container is filled with the molten wax such that the molten wax stands up, under surface tension, above said peripheral edge of said opening of said container.

3. A method as defined in claim 1, also including the steps of:
   applying the predetermined amount of molten wax to a generally central region of the downwardly facing face of the wafer; and
   then, spinning the wafer, while keeping it in a generally horizontal plane, around a vertically extending central axis of the wafer to spread, under centrifugal force, the molten wax radially outwards over the entire surface of the downwardly facing face of the wafer.

4. A method as defined in claim 1, including:
   supporting a central region of the upwardly facing face of the wafer to hold the same horizontally with the other face thereof facing downwardly.

5. A method as defined in claim 4, including: applying vacuum to the central region of the upwardly facing face of the wafer to support the same.

6. A method of applying molten wax to one face of a wafer, comprising the steps of:
   preparing a container containing the molten wax and having an upwardly facing opening;
   holding the wafer substantially horizontally above said opening of said container, with one face of the wafer facing downwardly toward said opening of said container;
   moving said container toward and away from the downwardly facing face of the wafer, between a downward position where said opening of said container is spaced downwardly from the downwardly facing face of the wafer, and an upward position where the peripheral edge of said opening of said container is brought into contact with the downwardly facing face of the wafer, to apply a predetermined amount of the molten wax to the downwardly facing face of the wafer.

7. A method as defined in claim 6, further including the steps of:
   preparing a reservoir containing the molten wax; and fully immersing said container in the molten wax whithin said reservoir when said container is moved to said downward position, to fill said container with the molten wax.

8. A method as defined in claim 7 further including the steps of:
   heating the molten wax within said reservoir to a predetermined temperature.

9. A method as defined in claim 6 further including the steps of:
   supplying the predetermined amount of molten wax to said container filled with the molten wax when the same is in said downward position, to cause the predetermined amount of molten wax to stand up, under surface tension, above a peripheral edge of said opening of said container.

10. A method as defined in claim 9 further including the steps of:
    heating the molten wax within said container to a predetermined temperature.

11. A method as defined in claim 1 further including the steps of:
    heating the wafer to a predetermined temperature before the predetermined amount of molten wax is applied to the downwardly facing face of the wafer.

12. A method of applying molten wax to one face of a wafer, comprising the steps of:
    preparing a container containing the molten wax and having an upwardly facing opening;
    holding the wafer substantially horizontally above said opening of said container, with one face of the wafer facing downwardly toward said opening of said container;
    moving at least one of said container and the wafer toward the other to bring the peripheral edge of said opening of said container and the downwardly facing face of the wafer into contact with each other to apply a predetermined amount of said molten wax to said one face of the wafer;
    heating walls surrounding a spinning wafer; and
    leading the wax received by the surrounding walls to the container to merge the wax in the wax contained therein.

13. A method as defined in claim 12 wherein the walls surrounding the spinning wafer is heated to a temperature higher than the melting point of the wax.

14. An apparatus for applying molten wax to one face of a wafer, comprising:
- a container for containing the molten wax and having an upwardly facing opening;
- holder means for holding a wafer substantially horizontally above said opening of said container, with one face of the wafer facing downwardly toward said opening of said container;
- moving means for moving at least one of said container and said holder means toward the other to bring said opening of said container and the downwardly facing face of the wafer held horizontally, into contact with each other to apply a predetermined amount of molten wax within said container to the face of the wafer, said moving means being connected to said container to move the same toward and away from the downwardly facing face of the wafer held horizontally by said holder means, between a downward position where said opening of said container is spaced downwardly from the downwardly facing face of the wafer and an upward position where said opening of said container is brought into contact with the downwardly facing face of the wafer to apply the predetermined amount of molten wax to the downwardly facing face of the wafer; and
- a reservoir for containing the molten wax, said container being fully immersed in the molten wax within said reservoir when said container is moved to said downward position by said moving means, to fill said container with the molten wax.

15. An apparatus as defined in claim 14, further including: means associated with said reservoir for heating the molten wax within said reservoir to a predetermined temperature.

16. An apparatus for applying molten wax to one face of a wafer, comprising:
- a container for containing the molten wax and having an upwardly facing opening;
- holder means for holding a wafer substantially horizontally above said opening of said container, with one face of the wafer facing downwardly toward said opening of said container;
- moving means for moving at least one of said container and said holder means toward the other to bring said opening of said container and the downwardly facing face of the wafer held horizontally into contact with each other to apply a predetermined amount of molten wax within said container to the face of the water, said moving means being connected to said container to move the same toward and away from the downwardly facing face of the wafer held horizontally by said holder means between a downward position where said opening of said container is spaced downwardly from the downwardly facing face of the wafer and an upward position where said opening of said container is brought into contact with the downwardly facing face of the wafer to apply the predetermined amount of molten wax to the downwardly facing face of the wafer; and
- a reservoir having an open top defined by a rim and adapted to retain the molten wax, said rim being higher than said opening of said container when said container is at said downward position, said rim being lower than said opening of said container when said container is at said upward position so as to supply the predetermined amount of molten wax to said container when the same is in said downward position, to cause the predetermined amount of molten wax to stand up, under surface tension, above a peripheral edge of said opening of said container.

17. An apparatus as defined in claim 16, further including: filter means for filtering the molten wax supplied to said container by said wax supply means.

18. An apparatus as defined in claim 16, further including: means associated with said container for heating the molten wax within said container to a predetermined temperature.

19. An apparatus as defined in claim 14, further including:
- means associated with said holder means for heating the wafer held by said holder means to a predetermined temperature before the predetermined amount of molten wax is applied to the downwardly facing face of the wafer.

20. An apparatus as defined in claim 14, further including: heater means for heating walls surrounding spinning wafer; and
- means for leading wax received by the walls surrounding the spinning wafer to the container.

21. An apparatus as defined in claim 20 wherein the heater is means applys heat to the walls so that the walls are heated to a temperature higher than the melting point of the wax.

* * * * *